(12) United States Patent
Chen et al.

(10) Patent No.: US 9,000,751 B2
(45) Date of Patent: Apr. 7, 2015

(54) VOLTAGE DETECTING CIRCUIT

(75) Inventors: Po-Hung Chen, Tokyo (JP); Makoto Takamiya, Tokyo (JP); Takayasu Sakurai, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 256 days.

(21) Appl. No.: 13/396,235

(22) Filed: Feb. 14, 2012

(65) Prior Publication Data

US 2012/0212212 A1 Aug. 23, 2012

(30) Foreign Application Priority Data

Feb. 18, 2011 (JP) .................................. 2011-33619

(51) Int. Cl.
  G01R 1/30 (2006.01)
  G01R 19/165 (2006.01)
  G01F 3/20 (2006.01)
(52) U.S. Cl.
  CPC ............ *G01R 19/16519* (2013.01); *G01F 3/20* (2013.01)
(58) Field of Classification Search
  None
  See application file for complete search history.

(56) References Cited

U.S. PATENT DOCUMENTS

| | | | | | |
|---|---|---|---|---|---|
| 4,224,539 | A | * | 9/1980 | Musa et al. ...................... | 327/78 |
| 4,321,489 | A | * | 3/1982 | Higuchi et al. .................. | 327/76 |
| 5,467,048 | A | * | 11/1995 | Watanabe ....................... | 327/436 |
| 5,612,614 | A | * | 3/1997 | Barrett et al. .................. | 323/316 |
| 5,973,548 | A | * | 10/1999 | Ukita et al. .................... | 327/540 |
| 6,246,272 | B1 | | 6/2001 | Takai | |
| 2008/0122539 | A1 | * | 5/2008 | Ide ................................ | 330/254 |
| 2010/0141332 | A1 | * | 6/2010 | Byeon ........................... | 327/536 |
| 2010/0176874 | A1 | * | 7/2010 | Sugiura et al. ................. | 327/537 |

FOREIGN PATENT DOCUMENTS

| | | |
|---|---|---|
| JP | A-6-230044 | 8/1994 |
| JP | A-2009-198476 | 9/2009 |

OTHER PUBLICATIONS

Sep. 2, 2014 Japanese Office Action issued in Japanese Application No. JP 2011-033619 (with English translation).

* cited by examiner

*Primary Examiner* — Melissa Koval
*Assistant Examiner* — Courtney McDonnough
(74) *Attorney, Agent, or Firm* — Oliff PLC (57) ABSTRACT

In a voltage detecting circuit, a transistor is configured as a P-type MOSFET, and includes a source connected with an input terminal, a gate connected with a ground voltage terminal and a drain connected with an output terminal. A transistor is configured as a P-type MOSFET, and includes a gate and a source connected with the output terminal and a drain connected with the ground terminal. Gate width and gate length of the transistor and gate width and gate length of the transistor are adjusted so that source-drain current flowing between the source and the drain of the transistor becomes equal to source-drain current flowing between the source and the drain of the transistor when the voltage applied to the input terminal is set to be preset trigger voltage. This configuration accomplishes detecting that the input voltage exceeds the trigger voltage with simple configuration.

4 Claims, 4 Drawing Sheets

VOLTAGE DETECTING CIRCUIT

BACKGROUND OF THE INVENTION

1. Field of the Invention

The present invention relates to a voltage detecting circuit. More specifically, the invention relates to a voltage detecting circuit configured to detect that voltage applied to an input terminal exceeds preset trigger voltage.

2. Description of the Prior Art

One proposed structure of the voltage detecting circuit includes a reference voltage generating circuit having an NMOS depletion transistor that a drain thereof is connected with a power supply terminal and a source thereof is connected with a gate thereof, and an NMOS enhancement transistor that a drain and a gate thereof are connected with the drain of the NMOS depletion transistor and a source thereof is connected to ground. The voltage detecting circuit also includes a comparator configured to compare detecting voltage that is obtained by dividing input voltage by two resistances with reference voltage that is output from the reference voltage generating circuit, and outputs a signal that is based on comparative result of the comparator (see, for example, patent document 1). In this prior art voltage detecting circuit, operation described above enables to detect that detected voltage based on the voltage of the input terminal becomes higher than the reference voltage.

Patent Document 1: Japanese Patent Laid-Open No. 2009-198476

Because of necessity for the reference voltage circuit and the comparator, in the above voltage detecting circuit, the size of circuit is comparatively large. In the reference voltage circuit of the above voltage detecting circuit, the gate of the NMOS depletion transistor is connected with the drain thereof, and the gate of the NMOS enhancement transistor is connected with the drain thereof. Because of these connections, current continues to flow from the NMOS depletion transistor to the NMOS enhancement transistor when voltage is applied to the power supply terminal, and power consumption becomes comparatively large.

SUMMARY OF THE INVENTION

In a voltage detecting circuit of present invention, there would thus be a demand for detecting voltage that is input to the input terminal with simple configuration. In the detecting circuit, there would also be a demand for reduction of the power consumption.

The present invention accomplishes at least part of the demands mentioned above by the following configurations applied to the voltage detecting circuit.

According to one aspect, the invention is directed to a voltage detecting circuit configured to detect that voltage applied to an input terminal exceeds preset trigger voltage. The voltage detecting circuit includes a first transistor and a second transistor. The first transistor is configured as a P-type field-effect transistor, and includes a source connected with the input terminal directly or indirectly, a gate connected with a low voltage input terminal and a drain connected with an output terminal. The low voltage input terminal is applied preset low voltage that is set to be lower than the trigger voltage. The second transistor is configured as a P-type field-effect transistor, includes a gate and a source connected with the output terminal respectively and a drain connected with the low voltage input terminal. Gate width and gate length of the second transistor is adjusted so that current between the source and the drain becomes approximately same as current between the source and the drain of the first transistor when the voltage applied to the input terminal reaches the trigger voltage.

In the voltage detecting circuit according to this aspect of the invention, the gate width and the gate length of the second transistor are adjusted so that the current between the source and the drain of the second transistor becomes approximately same as the current between the source and the drain of the first transistor when the voltage applied to the input terminal reaches the trigger voltage. When the voltage applied to the input terminal is lower than the trigger voltage, the current between the source and the drain of the second transistor is larger than that of the first transistor. Voltage that is in the vicinity of the low voltage input terminal is output from the output terminal. When the voltage applied to the input terminal exceeds the trigger voltage, the current between the source and the drain of the first transistor is equal to or larger than that of the second transistor. Voltage that is in the vicinity of voltage applied to the source of the first transistor is output from the output terminal. Such a configuration accomplishes detecting that voltage input to the input terminal exceeds the trigger voltage. The voltage detecting circuit described above may have two transistors, that is, the first transistor and the second transistor. Detecting voltage input to the input terminal with simple configuration is accomplished. The gate and the source of the second transistor are connected with the output terminal. The voltage detecting circuit is configured so that the current between the source and the drain of the second transistor is comparatively low when voltage between the gate and the source of the second transistor is zero. Such a configuration accomplishes the reduction of the power consumption.

In one preferable application of the voltage detecting circuit according to the above aspect of the invention, the first transistor and the second transistor may be enhancement type transistors. Such a configuration accomplishes the reduction of the power consumption.

In another preferable application of the voltage detecting circuit according to the above aspect of the invention, the voltage detecting circuit may further include a third transistor configured as a P-type field-effect transistor. The third transistor includes a gate and a drain connected with the source of the first transistor and a source connected with the input terminal. Such a configuration enables to lower voltage applied to the source of the first transistor up to less than the trigger voltage when the voltage that is input to the input terminal is equal to the trigger voltage. Such a configuration enables to adjust the gate width and the gate length of the first and second transistors properly. In the voltage detecting circuit described above, the third transistor may be an enhancement type transistor. The size of the first transistor obtained by dividing the gate width by the gate length may be same as that of the third transistor, and the size of the second transistor may be not less than 500 times and no more than 3000 time as large as that of the first transistor and that of the third transistor.

In one preferable application of the voltage detecting circuit according to the above aspect of the invention, the voltage detecting circuit may further include: a multiple transistor circuit including n (the n is an integer, and more than or equal to value 2) transistors connected in series with each other. Each of the transistors may be configured as a P-type field-effect transistor and may include a gate connected with a drain and a source connected with a drain of the next transistor. A source of the transistor that is located at the beginning of the n transistors is connected with the input terminal, and a gate and a drain of the transistor that are located at the end of the n transistors are connected with the source of the first transistor. Such a configuration enables to lower voltage applied to the source of the first transistor up to less than the trigger voltage when the voltage input to the input terminal is equal to the trigger voltage. In the voltage detecting circuit described above, each of the n transistors of the multiple transistor circuit may be an enhancement type transistor. Such a configuration accomplishes more reduction of the power consumption.

According to another aspect, the invention is directed to a voltage detecting circuit configured to detect that voltage applied to an input terminal exceeds preset trigger voltage. The voltage detecting circuit includes a first transistor and a second transistor. The first transistor is configured as an N-type field-effect transistor, and includes a drain connected with the input terminal directly or indirectly and a gate and a source connected with an output terminal respectively. The second transistor is configured as an N-type field-effect transistor, includes a gate connected with the drain of the first transistor, a source connected with a low voltage input terminal and a drain connected with the output terminal. Gate width and gate length of the second transistor is adjusted so that current between the source and the drain becomes approximately same as current between the source and the drain of the first transistor when the voltage applied to the input terminal reaches the trigger voltage. The low voltage input terminal applied to preset low voltage that is set to be lower than the trigger voltage.

In one preferable application of the voltage detecting circuit according to the above aspect of the invention, the second transistor includes the gate connected with the drain of the first transistor, the source connected with the low voltage input terminal and the drain connected with the output terminal. The gate width and the gate length of the second transistor are adjusted so that the current between the source and the drain becomes approximately same as the current between the source and the drain of the first transistor when the voltage applied to the input terminal reaches the trigger voltage. The low voltage input terminal is applied to the preset low voltage that is set to be lower than the trigger voltage. When the voltage applied to the input terminal is lower than the trigger voltage, the current between the source and the drain of the first transistor is larger than that of the second transistor. Voltage that is in the vicinity of voltage applied to the drain of the second transistor is output from the output terminal. When the voltage applied to the input terminal exceeds the trigger voltage, the current between the source and the drain of the second transistor is equal to or more than that of the first transistor. Voltage that is in the vicinity of the preset low voltage applied to the source of the second transistor is output from the output terminal. Such a configuration accomplishes detecting that voltage input to the input terminal exceeds the trigger voltage. The voltage detecting circuit described above may include two transistors, that is, the N-type first transistor and the N-type second transistor. Detecting voltage that is input to the input terminal with simple configuration is accomplished. The gate and the source of the first transistor are connected with the output terminal. The voltage detecting circuit is configured so that the current between the source and the drain of the fist transistor is comparatively low when voltage between the gate and the source of the first transistor is zero. Such a configuration accomplishes the reduction of the power consumption.

In one preferable application of the voltage detecting circuit according to the above aspect of the invention, the first transistor and the second transistor may be enhancement type transistors. Such a configuration accomplishes the reduction of the power consumption.

In another preferable application of the voltage detecting circuit according to the above aspect of the invention, the voltage detecting circuit further includes a third transistor. The third transistor is configured as a N-type field-effect transistor, and includes a gate and a drain connected with the input terminal respectively and a source connected with the drain of the first transistor. Such a configuration enables to lower voltage applied to the drain of the first transistor up to less than the trigger voltage when the voltage input to the input terminal is equal to the trigger voltage. Such a configuration enables to adjust the gate width and the gate length of the first and second transistors properly. In the voltage detecting circuit described above, the third transistor may be an enhancement type transistor. Such a configuration enables to reduce the power consumption. The size of the first transistor obtained by dividing the gate width by the gate length may be same as that of the third transistor, and the size of the second transistor may be not less than 500 times and no more than 3000 time as large as that of the first transistor and that of the third transistor.

In one preferable application of the voltage detecting circuit according to the above aspect of the invention, the voltage detecting circuit may further include a multiple transistor circuit. The multiple transistor circuit includes n (the n is an integer, and more than or equal to value 2) transistors connected in series with each other. Each of the transistors is configured as an N-type field-effect transistor and includes a gate connected with a drain and a source connected with a drain of the next transistor. A gate and a drain of the transistor that is located at the beginning of the n transistors are connected with the input terminal, and a source of the transistor that is located at the end of the n transistors is connected with the drain of the first transistor. Such a configuration enables to lower voltage applied to the drain of the first transistor up to less than the trigger voltage when the voltage input to the input terminal is equal to the trigger voltage. In the voltage detecting circuit described above, each of the n transistors of the multiple transistor circuit maybe an enhancement type transistor. Such a configuration accomplishes more reduction of the power consumption.

In one preferable application of the voltage detecting circuit according to the above aspect of the invention, the voltage detecting circuit may further include an amplifier configured to amplify voltage from the output terminal and to output the amplified voltage.

DESCRIPTION OF THE PREFERRED EMBODIMENTS

One mode of carrying out the invention is described below as a preferred embodiment.

Figure 1:
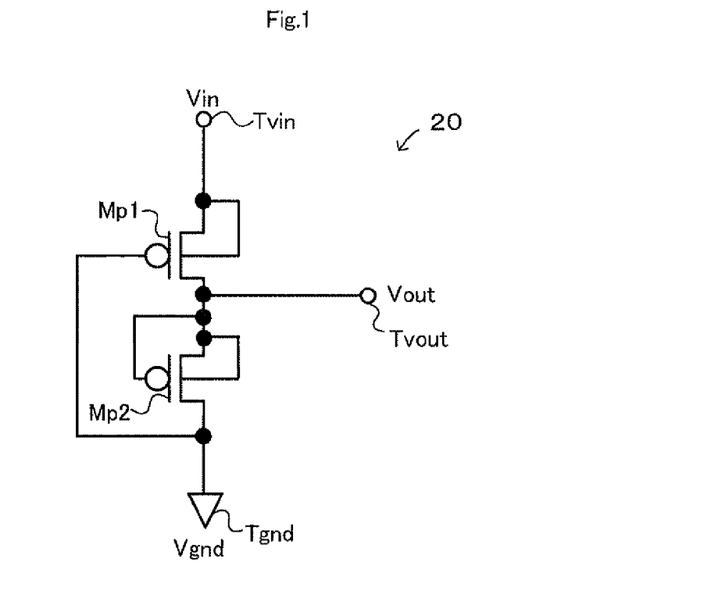
FIG. 1 illustrates schematic circuit diagram showing the configuration of a voltage detecting circuit 20 in the first embodiment of the invention.

FIG. 1 illustrates schematic circuit diagram showing the configuration of the voltage detecting circuit 20 in the first embodiment of the invention. The voltage detecting circuit 20 includes transistors Mp1 and Mp2. The transistor Mp1 is configured as a P-type MOSFET (Metal-Oxide-Semiconductor Filed-Effect Transistor), and includes a source connected with an input terminal Tvin, a gate connected with a ground voltage terminal Tgnd applied ground voltage thereto (for example, zero V), and a drain connected with an output terminal Tvout. The transistor Mp2 is configured as a P-type MOSFET, and includes a gate and a source connected with the output terminal Tvout and a drain connected with the ground terminal Tgnd.

Each of the transistors Mp1 and Mp2 is configured as an enhancement type MOSFET of which threshold voltage Vth is more than zero (for example, 0.8V). Gate width W1 and gate length L1 of the transistor Mp1 and gate width W2 and gate length L2 of the transistor Mp2 are adjusted so that source-drain current Ip2 flowing between the source and the drain of the transistor Mp2 becomes equal to source-drain current Ip1 flowing between the source and the drain of the transistor Mp1 when the voltage applied to the input terminal Tvin (hereafter referred to as 'input voltage Vin') is set to be preset trigger voltage $V_{Trigger}$ (for example, 0.5V). The following is the reason for adjusting the gate width W1 and the gate length L1 of the transistor Mp1 and the gate width W2 and the gate length L2 of the transistor Mpg.

When the input voltage Vin is equal to or less than the threshold voltage Vth, the transistor Mp1 operates in subthreshold region. At this time, the source-drain current Ip1 is expressed by equations (1) and (2). In the equation (1), 'k' represents Boltzmann coefficient, 'n' represents carrier concentration, 'T' represents absolute temperature, represents elementary charge, $V_{GS}$ represents voltage between gate and source, and '$V_{dS}$' represents voltage between source and drain. In the equation (2), '$\square_{si}$' is equal to 11.7×8.85 ×10$^{-14}$ F/cm, '$N_{DEP}$' represents channel doping concentration, '$\square$s' represents surface potential, '$k_B$' represents Boltzmann coefficient, and '$V_{DD}$' represents the voltage applied to the input terminal Tvin (i.e. the input voltage Vin). KT/q is 26 mV at room. temperature (for example, 27 degrees C.). The source-drain current Ip1 is expressed by equation (3).

$$I_{P1} = I_o e^{q\frac{V_{GS}-V_{th}}{nkT}} (1 - e^{\frac{-qVds}{kT}}) \quad (1)$$

$$I_0 = \mu \frac{W_1}{L_1} \sqrt{\frac{q\varepsilon_{si}N_{DEP}}{2\phi_s}} \left(\frac{k_B T}{q}\right)^2 = X\frac{W_1}{L_1} \quad (2)$$

$$I_{P1} = X \frac{W_1}{L_1} e^{q\frac{V_{DD}-V_{th}}{nkT}} \quad (3)$$

The gate of the transistor Mpg is connected with the source thereof to be turned off normally. The source-drain current Ip2 is expressed by equation (4).

$$I_{P2} = X \frac{W_2}{L_2} e^{q\frac{-V_{th}}{nkT}} \quad (4)$$

When the source-drain current Ip1 is lower than the source-drain current Ip2, the voltage of the output terminal Tvout becomes approximately ground voltage. When the source-drain current Ip1 increases to be higher than the source-drain current Ip2, the voltage of the output terminal Tvout varies from approximately ground voltage to approximately input voltage Vin. The input voltage Vin that equalizes the source-drain currents Ip1 and Ip2 is expressed by equation (5). The trigger voltage $V_{Trigger}$ is preliminarily set. The gate width W1 and W2 and the gate length L1 and L2 are adjusted so that the transistor size S1 obtained by dividing the gate width W1 by the gate length L1 (i.e. W1/L1) and the transistor size S2 obtained by dividing the gate width W2 by the gate length L2 (i.e. W2/L2) are satisfied with the equation (5). When the input voltage Vin is lower than the trigger voltage $V_{Trigger}$, voltage that is in the vicinity of the ground voltage is output from the output terminal Tvout. When the input voltage yin exceeds the trigger voltage $V_{Trigger}$, voltage that is in the vicinity of the input voltage Vin is output from the output terminal Tvout. Such a configuration accomplishes detecting that the input voltage Vin exceeds the trigger voltage $V_{Trigger}$ with simple configuration. The voltage detecting circuit 20 described above includes two transistors, that is, the transistors Mp1 and Mp2. Thus detecting voltage with simple configuration is accomplished. Each of the transistors Mp1 and Mp2 is configured as an enhancement type MOSFET. The gate of the transistor Mp2 is connected with the source thereof. In this configuration, the transistor Mp2 operates in subthreshold region and the source-drain current Ip2 is very small. Such a configuration accomplishes the reduction of the power consumption. The voltage detecting circuit 20 is configured of only P-type MOSFET. Thus the voltage detecting circuit 20 is able to be easily produced by a few processes, and reduction of the process variability, for example, reduction of variability in the threshold voltage Vth etc., is accomplished.

$$V_{Trigger} = V_{DD} = \frac{nkT}{q} \ln\left(\frac{W_2}{W_1} \times \frac{L_1}{L_2}\right) \quad (5)$$

In the voltage detecting circuit 20 of the first embodiment, the voltage detecting circuit 20 includes transistors Mp1 and Mp2. The transistor Mp1 is configured as a P-type MOSFET, and includes the source connected with the input terminal Tvin, the gate connected with the ground voltage terminal Tgnd and the drain connected with the output terminal Tvout. The transistor Mp2 is configured as a P-type MOSFET, and includes the gate and the source connected with the output terminal Tvout and the drain connected with the ground terminal Tgnd. The Gate width W1 and the gate length L1 of the transistor Mp1 and the gate width W2 and the gate length L2 of the transistor Mp2 are adjusted so that source-drain current Ip2 flowing between the source and the drain of the transistor Mp2 becomes equal to the source-drain current Ip1 flowing between the source and the drain of the transistor Mp1 when the voltage applied to the input terminal Tvin is set to be the preset trigger voltage $V_{Trigger}$. Such a configuration accomplishes detecting that the input voltage Vin exceeds the trigger voltage $V_{Trigger}$ with simple configuration. Each of the transistors Mp1 and Mp2 is configured as an enhancement type MOSFET. The gate of the transistor Mp2 is connected with the source thereof. In this configuration, the transistor Mp2 operates in subthreshold. region and the source-drain current Ip2 is very small. Such a configuration accomplishes the reduction of the power consumption.

Figure 2:
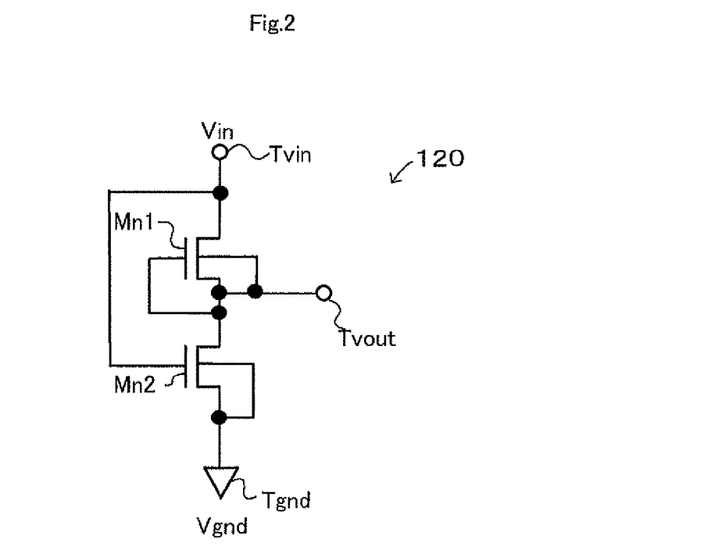
FIG. 2 illustrates schematic circuit diagram showing the configuration of a voltage detecting circuit 120 in the second embodiment of the invention.

Next, a voltage detecting circuit 120 in the second embodiment of the invention is described below. FIG. 2 illustrates schematic circuit diagram showing the configuration of the voltage detecting circuit 120 in the second embodiment of the invention. The voltage detecting circuit 120 includes transistors Mn1 and Mn2. The transistor Mn1 is configured as a N-type MOSFET, and includes a drain connected with the input terminal Tvin and a gate and a source connected with the output terminal Tvout. The transistor Mn2 is configured as a N-type MOSFET, and includes a gate connected with the drain of the transistor Mn1, a source connected with the ground terminal Tgnd and a drain connected with the output terminal Tvout.

Each of the transistors Mn1 and Mn2 is configured as an enhancement type transistor. Gate width and gate length of the transistors are adjusted so that source-drain current flowing between the source and the drain of the transistor Mn1 becomes equal to source-drain current flowing between the source and the drain of the transistor Mn2 when the input voltage Vin is set to be the preset trigger voltage $V_{Trigger}$. In the voltage detecting circuit 120, when the input voltage Vin is lower than the trigger voltage $V_{Trigger}$, the current flowing between the source and the drain of the transistor Mn1 is higher than the current flowing between the source and the drain of the transistor Mn2. Voltage that is in the vicinity of voltage applied to the drain of the transistor Mn1 (i.e. the trigger voltage $V_{Trigger}$) is output from the output terminal Tvout. When the input voltage Vin exceeds the trigger voltage $V_{Trigger}$, the current flowing between the source and the drain of the transistor Mn2 exceeds the current flowing between the source and the drain of the transistor Mn1. Voltage that is in the vicinity of the ground voltage applied to the source of the transistor Mn2 is output from the output terminal Tvout. Such a configuration accomplishes detecting that the input voltage Vin exceeds the trigger voltage $V_{Trigger}$ with simple configuration. Each of the transistors Mn1 and Mn2 is configured as an enhancement type MOSFET. The gate of the transistor Mn1 is connected with the source thereof. In this configuration, the transistor Mn1 operates in subthreshold region and the current flowing between source and drain is very small. Such a configuration accomplishes the reduction of the power consumption. The voltage detecting circuit 120 is configured of only N-type MOSFETs. Thus the voltage detecting circuit 120 is able to be easily produced by a few processes, and reduction of the process variability, for example, reduction of variability in the threshold voltage Vth etc., is accomplished.

In the voltage detecting circuit 120 of the second embodiment, the voltage detecting circuit 120 includes the transistors Mn1 and Mn2. The transistor Mn1 is configured as an N-type MOSFET, and includes a drain connected with the input terminal Tvin and a gate and a source connected with the output terminal Tvout. The transistor Mn2 is configured as an N-type MOSFET, and includes a gate connected with the drain of the transistor Mn1, a source connected with the ground terminal Tgnd and a drain connected with the output terminal Tvout. The Gate width and the gate length of the transistors are adjusted so that source-drain current flowing between the source and the drain of the transistor Mn1 becomes equal to source-drain current flowing between the source and the drain of the transistor Mn2 when the input voltage Vin is set to be the preset trigger voltage $V_{Trigger}$. This configuration accomplishes detecting that the input voltage yin exceeds the trigger voltage $V_{Trigger}$ with simple configuration. Each of the transistors Mn1 and Mn2 is configured as an enhancement type MOSFET. The gate of the transistor Mn1 is connected with the source thereof. In this configuration, the transistor Mn1 operates in subthreshold region and the current flowing between source and drain is very small. Such a configuration accomplishes the reduction of the power consumption. The voltage detecting circuit 120 is configured of only N-type MOSFETs. Thus the voltage detecting circuit 120 is able to be easily produced by a few processes, and reduction of the process variability, for example, reduction of variability in the threshold voltage Vth etc., is accomplished.

Figure 3:
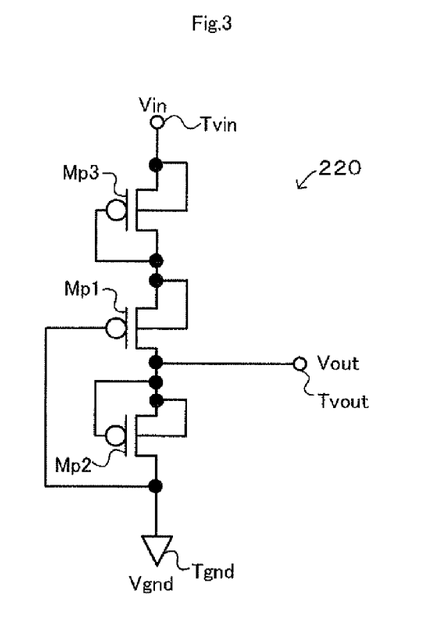
FIG. 3 illustrates schematic circuit diagram showing the configuration of a voltage detecting circuit 220 in the third embodiment of the invention.

Next, a voltage detecting circuit 220 in the third embodiment of the invention is described below. FIG. 3 illustrates schematic circuit diagram showing the configuration of the voltage detecting circuit 220 in the third embodiment of the invention. As illustrated in FIG. 3, the voltage detecting circuit 220 includes a transistor Mp3 configured as an enhancement P-type MOSFET and connected between the input terminal Tvin and drain of the transistor Mp1 in the voltage detecting circuit 20 illustrated in FIG. 1.

The transistor Mp3 includes a gate and a drain connected with the source of the transistor Mp1 and a source connected with the input terminal Vin. The transistor size S3 obtained by dividing gate width W3 by gate length L3 (i.e. W3/L3) is adjusted so as to be equal to the transistor size S1 of the transistor Mp1. Thus source voltage of the transistor Mp1 is 0.5 time as large as the input voltage yin. At this time, the input voltage Vin that equalizes the source-drain current Ip1 with the source-drain current Ip2 is expressed by equations (6). Trigger voltage $V_{Trigger2}$ is preliminarily set to be half voltage of the trigger voltage $V_{Trigger}$. The gate width W1 and W2 and the gate length L1 and L2 is adjusted so that the transistor size S1 obtained by dividing the gate width W1 by the gate length L1 (i.e. W1/L1) and the transistor size S2 obtained by dividing the gate width W2 by the gate length L2 (i.e. W2/L2) are satisfied with the equation (6). When the input voltage Vin is lower than the trigger voltage $V_{Trigger2}$ voltage that is in the vicinity of the ground voltage is output from the output terminal Tvout.

When the input voltage yin exceeds the trigger voltage $V_{Trigger2}$, Voltage that is in the vicinity of the input voltage Vin is output from the output terminal Tvout.

$$V_{Trigger2} = V_{DD} = 2\frac{nkT}{q}\ln\left(\frac{W_2}{W_1} \times \frac{L_1}{L_2}\right) \qquad (6)$$

In the voltage detecting circuit 20 illustrated FIG. 1, when the trigger voltage $V_{Trigger}$ is 500 mV and the n is 1.1, ratio of the transistor size S2 (=W2/L2) of the transistor Mp2 divided by the transistor size S1 (=W1/L1) of the transistor Mp1 is expressed by equation (7). In the voltage detecting circuit 220 illustrated FIG. 3, the ratio of the transistor size S2 divided by the transistor size S1 is expressed by equation (8) when the trigger voltage $V_{Trigger}$ is 500 mV. Thus connecting the transistor Mp3 between the input terminal Tvin and the transistor Mp1 in the voltage detecting circuit 20 enables to lower the ratio of the transistor size of the transistors Mp1 and Mpg and to adjust each gate width and gate length of the transistors Mp1, Mpg and Mp3 more properly. In the third embodiment, the trigger voltage $V_{Trigger}$ is set to be 500 mV. By setting the trigger voltage $V_{Trigger}$ to be 400 mV and using equation (8), ratio of the transistor size S2 divided by the transistor size S1 may be set to be about 500.

$$\frac{W_2}{W1}\frac{L_1}{L_2} = e^{\frac{500}{26\times 1.2}} = e^{16.02} = 9000000 \qquad (7)$$

$$\frac{W_2}{W1}\frac{L_1}{L_2} = e^{\frac{250}{26\times 1.2}} = e^{8.01} = 3000 \qquad (8)$$

In the voltage detecting circuit 220 of the third embodiment, the gate and the drain of the transistor Mp3 are connected with the source of the transistor Mp1, and the source of the transistor Mp3 is connected with the input terminal Vin. The transistor size S3 obtained by dividing gate width W3 by gate length L3 is adjusted so as to be equal to the transistor size S1 of the transistor Mp1. This configuration enables to adjust each size of the transistors Mp1 and mp2.

Figure 4:
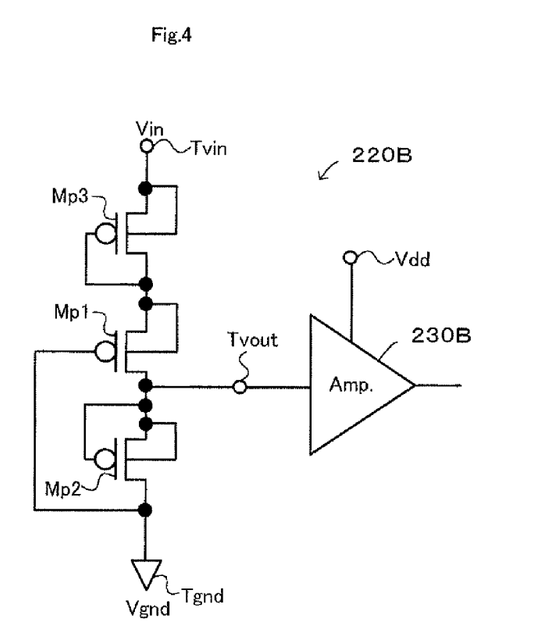
FIG. 4 illustrates schematic circuit diagram showing the configuration of a voltage detecting circuit 220B in another modified example.
Figure 5:
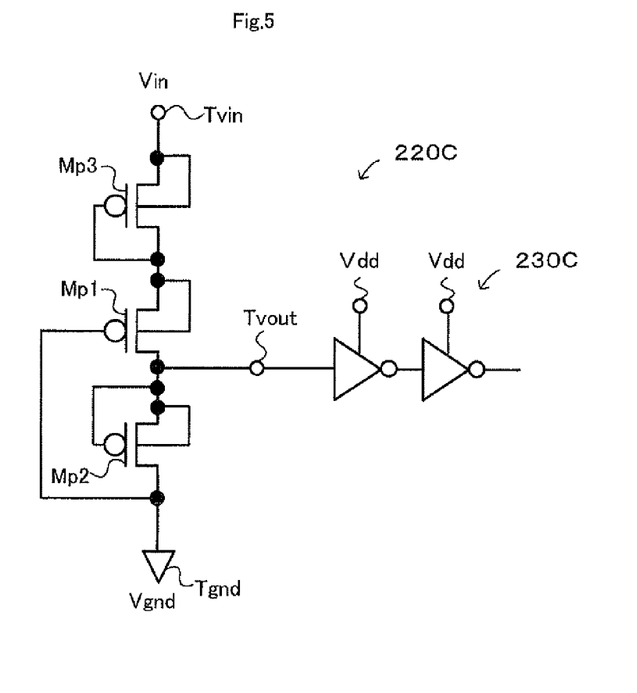
FIG. 5 illustrates schematic circuit diagram showing the configuration of a voltage detecting circuit 220C in another modified example.

In the voltage detecting circuit 220 of the third embodiment, as illustrated in FIG. 4 as a voltage detecting circuit 220B in modified example, an amplifier 230B amplifying the output voltage Vout may be connected with the output terminal Tvout. As illustrated in FIG. 5 as a voltage detecting circuit 220C in modified example, an inverter circuit 230C configured by multiple connecting with the plurality of inverters may be connected instead of the amplifier 230B. In this configuration, the output voltage Vout that is output from the output terminal Tvout is lower than the input voltage Vin. By connecting the amplifier 230B or the inverter circuit 230C with the output terminal Tvout, the amplifier 230B or the inverter circuit 230C enables to output voltage that is in the vicinity of the input voltage Vin.

In the voltage detecting circuit 220 of the third embodiment, the voltage detecting circuit 220 includes a transistor Mp3 connected between the input terminal Tvin and the drain of the transistor Mp1 in the voltage detecting circuit 20 illustrated in FIG. 1. The voltage detecting circuit 220 includes an N-type transistor connected between the input terminal Tvin and the drain of the transistor Mp1. The N-type transistor includes a gate and a drain connected with the input terminal Tvin and a source connected with the drain of the transistor Mp1.

Figure 6:
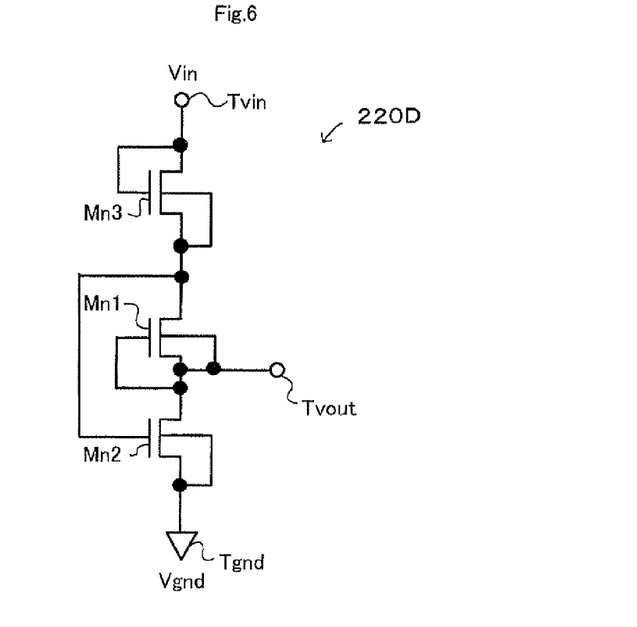
FIG. 6 illustrates schematic circuit diagram showing the configuration of a voltage detecting circuit 220D in another modified example.

In the voltage detecting circuit 220 of the third embodiment, the voltage detecting circuit 220 includes a transistor Mp3 connected between the input terminal Tvin and the drain of the transistor Mp1 in the voltage detecting circuit 20 illustrated in FIG. 1. As illustrated in FIG. 6 as a voltage detecting circuit 220D in modified example, the voltage detecting circuit 220D includes an N-type transistor Mn3 connected between the input terminal Tvin and the drain of the transistor Mn1 in the voltage detecting circuit 120 illustrated in FIG. 2. The transistor Mn3 includes a gate and a drain connected with the input terminal Tvin and a source connected with the drain of the transistor Mn1. This configuration enables to adjust each size of the transistors Mn1 and Mn2. In this case, the size of the transistor Mn1 obtained by dividing the gate width by the gate length may be same as that of the transistor Mn3, and the size of the transistor Mn2 may be not less than 500 times and no more than 3000 times as large as that of the transistor Mn1 and Mn3. In this case, the voltage detecting circuit includes a P-type transistor connected between the input terminal Tvin and the drain of the transistor Mn1. The transistor includes a gate and a drain connected with the drain of the transistor Mn1 and a source connected with the input terminal Tvin in the voltage detecting circuit 120 illustrated in FIG. 2.

Figure 7:
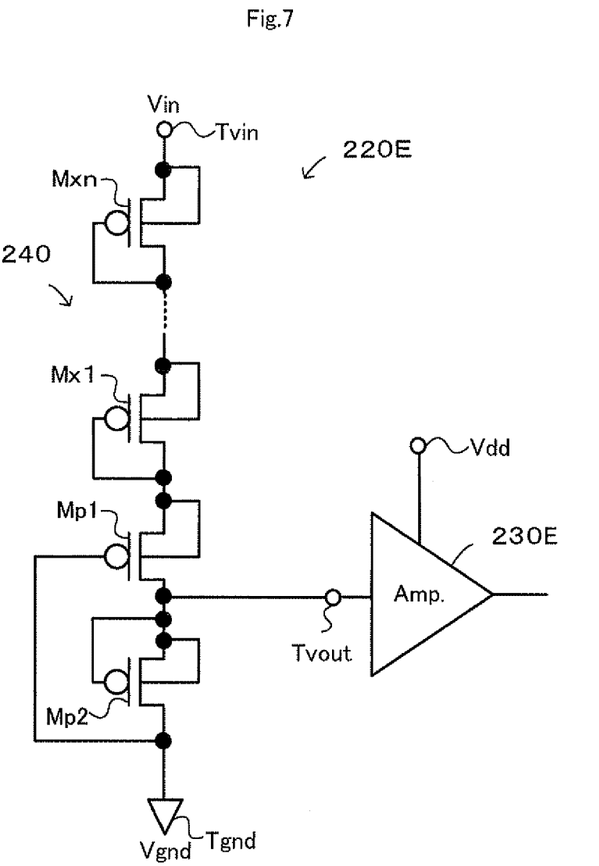
FIG. 7 illustrates schematic circuit diagram showing the configuration of a voltage detecting circuit 220E in another modified example.

In the voltage detecting circuit 220 of the third embodiment, the voltage detecting circuit 220 includes a transistor Mp3 connected between the input terminal Tvin and the transistor Mp1. As illustrated in FIG. 7 as a voltage detecting circuit 220E in modified example, a multiple transistor circuit 240 may include transistors Mx1-Mxn (the n is an integer, and more than or equal to 2) transistors connected in series with each other, and may be connected between the input terminal Tvin and the transistor Mp1. An amplifier 230E amplifying the output voltage Vout may be connected with the output terminal Tvout. Each of the transistors Mx1-Mxn is configured as a P-type MOSFET, and includes a gate connected with a drain, and a source connected a drain of the next transistor. As illustrated, the transistors Mx1-Mxn are connected in series. A source of the transistor Mxn located at the beginning of the transistors Mx1-Mxn is connected with the input terminal Tvin. A gate and a drain of the transistor Mx1 located at the end of the transistors Mx1-Mxn are connected with the source of the transistor Mp1. When each gate width and the gate length of the transistors Mx1-Mn1 is set to be same as the gate width W1 and the gate length L1 of the transistors Mp1, the trigger voltage $V_{Trigger}$ is expressed by equation (9). By setting the trigger voltage $V_{Trigger}$ and adjusting each gate width and gate length of the transistors Mp1 and Mpg so as to be satisfied with the equation (9), adjustment of the transistor size of the transistor Mp1 and Mp2 is accomplished more properly.

$$V_{TriggerN} = V_{DD} = N\frac{nkT}{q}\ln\left(\frac{W_2}{W_1}\times\frac{L_1}{L_2}\right) \qquad (9)$$

In the voltage detecting circuits 20 of the first embodiment to 220 of the third embodiment, the ground voltage terminal Tgnd is set to be applied voltage of 0V as the ground voltage thereto. The ground voltage terminal Tgnd may be applied lower voltage than the trigger voltage, for example, voltage of 0.2V etc.

In the voltage detecting circuits 20 of the first embodiment to 220 of the third embodiment, each of the transistors is set to be configured as an enhancement type MOSFET. Each of the transistors may be configured to flow a little bit of current when voltage difference between the gate and the source is equal to zero.

In the voltage detecting circuits 20 of the first embodiment to 220 of the third embodiment, each of the transistors is set to be configured as an MOFEST. Each of the transistors may be configured as MESFET (Metal-Semiconductor Field Effect Transistor).

The primary elements in the embodiment and its modified examples are mapped to the primary constituents in the claims of the invention as described below. In the first embodiment, the transistor Mp1 is equivalent to the 'first transistor'. The transistor Mp2 is equivalent to the 'second transistor'. In the second embodiment, the transistor Mn1 is equivalent to the 'first transistor'. The transistor Mn2 is equivalent to the 'second transistor'.

There may be many modifications, changes, and alterations without departing from the scope or spirit of the main characteristics of the present invention. The scope and spirit of the present invention are indicated by the appended claims, rather than by the foregoing description.

The technique of the present invention is preferably applied to the manufacturing industries of the voltage detecting circuit.

The disclose of Japanese Patent Application No. 2011-33619 filed Feb. 18, 2011 including specification, drawings and claims is incorporated herein by reference in its entirety.

What is claimed is:

1. A voltage detecting circuit configured to detect that voltage applied to an input terminal exceeds preset trigger voltage, the voltage detecting circuit comprising:

a first transistor configured as a P-type field-effect transistor, and including a source connected with the input terminal, a gate connected with a ground voltage terminal and a drain connected with an output terminal; and a second transistor configured as a P-type field-effect transistor including a gate and a source coupled to the drain of the first transistor, connected with the output terminal and a drain connected with the ground voltage terminal, wherein gate length and gate width of the first and the second transistors are adjusted to satisfy the following equation:

$$V_{Trigger} = \frac{nKT}{q} \ln\left(\frac{w2}{w1} \times \frac{L1}{L2}\right)$$

wherein '$V_{Trigger}$' represents the trigger voltage, 'L1' represents the gate length of the first transistor, 'W1' represents the gate width of the first transistor, 'L2' represents the gate length of the second transistor, 'W2' represents the gate width of the second transistor, 'n' represents carrier concentration, 'k' represents Boltzmann coefficient, 'T' represents absolute temperature and 'q' represents elementary charge, the voltage that is in the vicinity of the voltage applied to the input terminal is output from the output terminal when the voltage applied to the input terminal is lower than the trigger voltage, and the voltage that is in the vicinity of the voltage applied to the ground voltage terminal is output from the output terminal when the voltage applied to the input terminal is higher than the trigger voltage.

2. The voltage detecting circuit in accordance with claim 1, wherein the first transistor and the second transistor are enhancement type transistors.

3. The voltage detecting circuit in accordance with claim 1, the voltage detecting circuit further comprising:

an amplifier configured to amplify voltage from the output terminal and to output the amplified voltage.

4. The voltage detecting circuit in accordance with claim 2, the voltage detecting circuit further comprising:

an amplifier configured to amplify voltage from the output terminal and to output the amplified voltage.

* * * * *